United States Patent
Nogami

[11] Patent Number: 6,071,813
[45] Date of Patent: Jun. 6, 2000

[54] METHOD AND SYSTEM FOR ELECTRICAL COUPLING TO COPPER INTERCONNECTS

[75] Inventor: Takeshi Nogami, Sunnyvale, Calif.

[73] Assignee: Advanced Micro Devices, Inc., Sunnyvale, Calif.

[21] Appl. No.: 08/954,974

[22] Filed: Oct. 20, 1997

[51] Int. Cl.[7] .................................................. H01L 21/44

[52] U.S. Cl. ........................... 438/687; 438/710; 438/906

[58] Field of Search ..................................... 438/687, 710, 438/722, 725, 906

[56] References Cited

U.S. PATENT DOCUMENTS 5,395,650  3/1995  Holl et al. ................................ 427/250

*Primary Examiner*—Kevin M. Picardat
*Attorney, Agent, or Firm*—Sawyer Law Group LLP

[57] ABSTRACT

A system and method for providing electrical connection to a copper interconnect through a via hole is disclosed. The copper interconnect includes a surface having impurities. The method and system include chemically reducing the copper oxide and removing the carbon atoms at the surface. The chemical etching is performed using a reactive species. The reactive species reacts with the impurities on the surface of the copper interconnect to remove the impurities.

4 Claims, 1 Drawing Sheet

METHOD AND SYSTEM FOR ELECTRICAL COUPLING TO COPPER INTERCONNECTS

FIELD OF THE INVENTION

The present invention relates to copper interconnect formation and more particularly to a method and system for electrically coupling to copper interconnects having improved electrical connection and reduced copper contamination.

BACKGROUND OF THE INVENTION

Typically, a damascene process is used to form interconnects for semiconductor processing. First, a trench is formed in a dielectric film on a substrate. A barrier metal is deposited to prevent the copper which will form the interconnect from diffusing through the dielectric layer. Subsequently, chemical polishing is performed on the copper interconnect and other layers are formed above the copper interconnect.

In order to provide an electrical connection to the interconnect, a via is used. A via hole is made in the layers above the copper interconnect to expose the copper interconnect. The via hole will be filled with some metal to provide an electrical connection. However, the surface of the copper in the interconnect may be oxidized or contain impurities due primarily to the chemical polishing. As a result, sufficient electrical contact cannot be made to the copper interconnect.

Conventional systems, such as those used in aluminum interconnection technology, sputter the surface of the interconnect metal. Sputtering causes copper and impurity atoms to be ejected from the exposed surface of the copper interconnect. Although the sputtering process removes the impurities from the surface of the copper interconnect, the impurities and copper are redeposited on the sides of the via hole. Because copper diffuses readily, the copper can diffuse through the layers above the copper interconnect. This diffusion can contaminate any junctions formed on the substrate.

Accordingly, what is needed is a system and method for providing sufficient electrical connection to the copper interconnect without introducing copper impurities to the circuit. The present invention addresses such a need.

SUMMARY OF THE INVENTION

The present invention provides a method and system for providing electrical connection to a copper interconnect through a via hole. The copper interconnect includes a surface having impurities. The method and system comprises chemically reducing copper compounds at the surface of the copper interconnect. The chemical etch etching is performed using a reactive species. The reactive species reacts with the impurities on the surface of the copper interconnect to remove the impurities.

According to the system and method disclosed herein, the present invention allows for electrical connection to a via without introducing significant copper impurities to other portions of the circuit, thereby increasing overall system performance.

DETAILED DESCRIPTION OF THE INVENTION

The present invention relates to an improvement in circuit performance through formation of vias whose via resistance is low and uniform in a chip. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
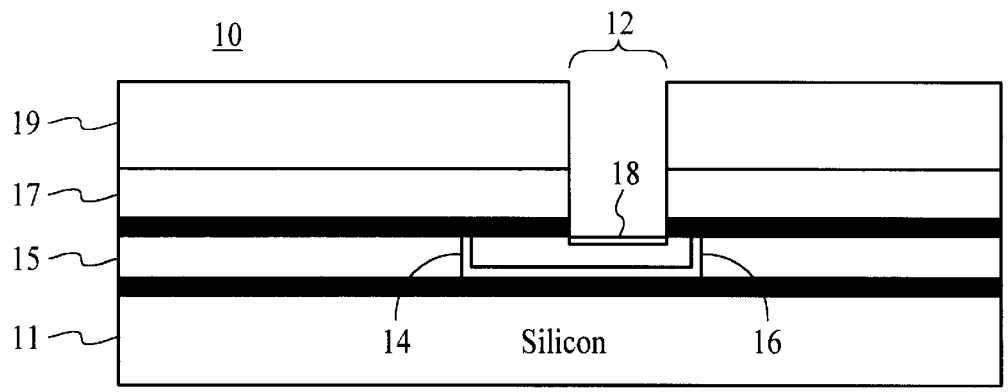
FIG. 1A is a block diagram of a copper interconnect and via hole formed using a conventional process.

FIG. 1A is a block diagram of a portion of a circuit 10 formed on a substrate 11. Typically, the substrate 11 is silicon. A damascene process has used to form an interconnect 16. First, a trench is formed in a dielectric layer 15 on the substrate 11. A barrier metal layer 14 is formed to prevent the copper which will form the interconnect from diffusing through the dielectric layer. The copper layer is then deposited to form the copper interconnect 16. Subsequently, chemical polishing is performed on the copper layer and a dielectric layer 17 and at least a second layer 19 are formed above the copper interconnect 16. The dielectric layer 17 is typically made of silicon dioxide.

In order to provide an electrical connection to the copper interconnect 14, a via is formed. To fabricate the via, a via hole 12 is made in the layers 17 and 19 above the copper interconnect 16 to expose the copper interconnect 16. The via hole 12 will be filled with some metal to provide an electrical connection. The metal in the via may be copper or tungsten. However, the exposed surface 18 of the copper in the interconnect may be oxidized or contain impurities due primarily to reactants used in the chemical polishing and due to reactants used in the etching of the dielectric film 17 to open the via. For example, the exposed surface 18 may include oxidized copper and carbon. As a result of these impurities, sufficient electrical contact cannot be made to the copper interconnect 16.

Figure 1B:
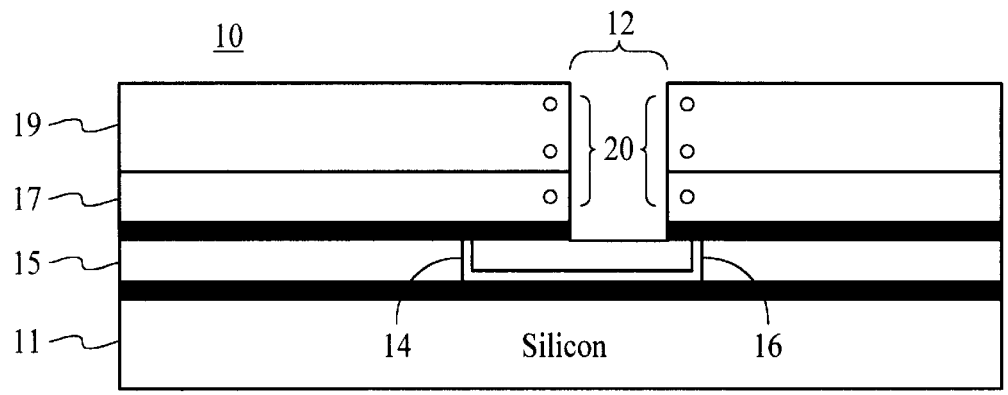
FIG. 1B is a block diagram of a conventional via hole and copper interconnect.

Conventional systems, such as those used in aluminum interconnection technology, sputter the surface of the interconnect metal. Typically in sputtering, an inert gas such as argon is used. FIG. 1B depicts the copper interconnect 16 and via hole 12 after sputtering. Sputtering causes ions of the inert gas, not shown, to strike the exposed surface 18 of the copper interconnect. The physical interaction between the inert gas ions causes the oxidized copper and impurity atoms to be ejected from the exposed surface 18 of the copper interconnect 16. As a result, the oxidized copper and impurity atoms are removed from the copper interconnect 16.

Although an electrical connection can be made through the via hole 12 to the copper interconnect 14, those with ordinary skill in the art will realize that the sputtering process causes the impurities and copper atoms, denoted generally at 20, to be redeposited on the sides of the via hole 12. Note that the number and exact placement of the redeposited copper atoms 20 are for illustration only. Consequently, any number of copper atoms 20 could be redeposited any place in the via hole 12. Because copper diffuses readily, the copper can diffuse through the layers above the copper interconnect. In particular, the copper atoms 20 in the dielectric layer 19 can diffuse through the dielectric layer 19. This diffusion through the dielectric layer 19 can contaminate the circuits formed on the substrate 11.

The present invention provides for a method and system for allowing electrical connection to a copper interconnect with reduced introduction of copper impurities to the layers above the copper interconnect. The present invention includes chemically removing the impurities on the surface of the copper interconnect to allow electrical connection to the copper interconnect. The present invention will be described in terms of the use of hydrogen gas to chemically remove the impurities. However, one of ordinary skill in the art will readily recognize that this method and system will operate effectively for other species which react with the impurities on the surface of the copper interconnect.

Figure 2:
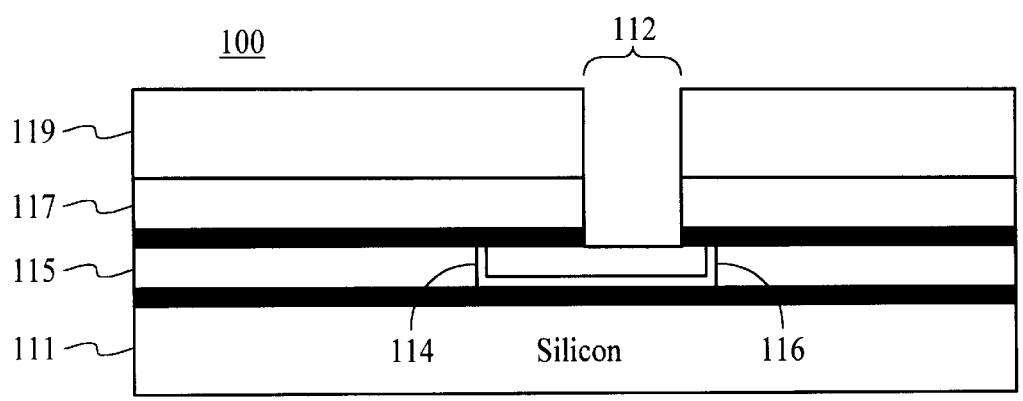
FIG. 2 is a block diagram of a via hole and copper interconnect in accordance with the method and system.

To more particularly illustrate the method and system in accordance with the present invention, refer now to FIG. 2 depicting a block diagram of one embodiment of such a system 100. The system 100 includes a copper interconnect 116, a barrier layer 114, a via hole 112, dielectric layers 115 and 117, and an additional layer 119 formed on the substrate 111. In a preferred embodiment, the substrate 11 is silicon and the dielectric layers 115 and 117 are silicon dioxide and silicon nitride, respectively. The dielectric layer 119 is silicon dioxide. In a preferred embodiment, the interconnect 116 and via hole 112 are formed as discussed above, leaving oxygen and carbon impurities on the surface of the copper interconnect 116.

Instead of removing the impurities using argon gas sputtering, the method and system use a gas which chemically reacts with the impurities. In a preferred embodiment, the method and system use hydrogen gas to form the plasma. As a result, a chemical interaction takes place between the oxidized copper and the hydrogen plasma and between the carbon and the hydrogen plasma. The hydrogen plasma reacts with the oxidized copper to form primarily copper, which remains in the copper interconnect 111, an oxygen-hydrogen radical and water. Similarly, the hydrogen plasma chemically reacts with the carbon. Thus, the hydrogen plasma chemically reduces the copper oxide and removes carbon atoms from the surface of the copper interconnect 116 through reduction. Consequently, copper atoms remain in the copper interconnect 116 and cannot be found on the side surfaces of the via hole 112. The via hole 112 can then be filled with copper to electrically couple to the copper interconnect 116 without introducing copper impurities which may diffuse through the dielectric layer 117.

A method and system has been disclosed for providing electrical connection to a copper interconnect with reduced copper contamination.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing electrical connection to a copper interconnect through a via hole, the copper interconnect including a surface having impurities, the method comprising the steps of:

causing a reaction between a reactive species in a plasma and the impurities on a portion of the surface of the copper interconnect exposed by the via hole to remove the impurities on the portion of the surface of the copper interconnect; and depositing copper in the via hole.

2. The method of claim 1 wherein the reaction causing step further comprises the step of:

reducing copper oxide and reacting with carbon atoms on the surface of the copper interconnect.

3. The method of claim 2 wherein the reactive species further comprises hydrogen gas.

4. The method of claim 1 wherein the reaction causing step further comprises the step of:

chemically reducing the copper oxide and removing carbon atoms at the surface of the copper.

* * * * *